US009745666B2

(12) United States Patent
Luter et al.

(10) Patent No.: US 9,745,666 B2
(45) Date of Patent: Aug. 29, 2017

(54) CONTINUOUS CZOCHRALSKI METHOD AND APPARATUS

(71) Applicant: GTAT IP Holding LLC, Merrimack, NH (US)

(72) Inventors: William L. Luter, St. Charles, MO (US); Weidong Huang, Bolton, MA (US)

(73) Assignee: GTAT IP HOLDING LLC, Merrimack, NH (US)

( * ) Notice: Subject to any disclaimer, the term of this patent is extended or adjusted under 35 U.S.C. 154(b) by 242 days.

(21) Appl. No.: 14/425,422

(22) PCT Filed: Sep. 9, 2013

(86) PCT No.: PCT/US2013/058774
§ 371 (c)(1),
(2) Date: Mar. 3, 2015

(87) PCT Pub. No.: WO2014/039976
PCT Pub. Date: Mar. 13, 2014

(65) Prior Publication Data
US 2015/0233014 A1    Aug. 20, 2015

Related U.S. Application Data

(60) Provisional application No. 61/699,004, filed on Sep. 10, 2012.

(51) Int. Cl.
*C30B 15/02* (2006.01)
*C30B 15/12* (2006.01)
(Continued)

(52) U.S. Cl.
CPC ............ *C30B 15/12* (2013.01); *C30B 15/002* (2013.01); *C30B 15/02* (2013.01); *C30B 29/06* (2013.01); *Y10T 117/1052* (2015.01)

(58) Field of Classification Search
CPC .......... C30B 15/00; C30B 15/02; C30B 15/12
See application file for complete search history.

(56) References Cited

U.S. PATENT DOCUMENTS 5,009,863 A * 4/1991 Shima ................... C30B 15/12
117/213
5,098,674 A * 3/1992 Matsuda ................ C30B 15/02
117/213
(Continued)

FOREIGN PATENT DOCUMENTS

EP    0 293 865 A1    12/1988
EP    0 368 586 A1    5/1990
(Continued)

OTHER PUBLICATIONS

Extended European Search Report dated May 10, 2016 in connection with European Application No. EP 13 83 5765.2.
(Continued)

*Primary Examiner* — Robert M Kunemund
(74) *Attorney, Agent, or Firm* — Parker Ibrahim & Berg LLC; Stephen D. LeBarron

(57) ABSTRACT

The present invention relates to a Czochralski growth apparatus and method, preferably a continuous Czochralski growth apparatus and method, in which solid feedstock provided from a delivery system during ingot growth is substantially prevented from entering the growth zone of a crucible. In this way, an ingot having exceptionally consistent properties is produced.

17 Claims, 3 Drawing Sheets

(51) Int. Cl.
C30B 15/00 (2006.01)
C30B 29/06 (2006.01)

(56) References Cited

U.S. PATENT DOCUMENTS

| | | | |
|---|---|---|---|
| 5,373,805 A * | 12/1994 | Takano | C30B 15/00 |
| | | | 117/13 |
| 5,891,245 A * | 4/1999 | Atami | C30B 15/02 |
| | | | 117/18 |
| 2007/0056504 A1 | 3/2007 | Lim | |
| 2010/0162946 A1 | 7/2010 | Bender | |
| 2011/0036860 A1 | 2/2011 | Fujiwara et al. | |
| 2012/0056135 A1 | 3/2012 | DeLuca et al. | |

FOREIGN PATENT DOCUMENTS

| | | |
|---|---|---|
| EP | 0787838 A1 | 8/1997 |
| JP | H04-92884 A | 3/1992 |
| JP | H04-209790 A | 7/1992 |
| JP | H04-321586 A | 11/1992 |

OTHER PUBLICATIONS

International Search Report mailed Dec. 19, 2013 in connection with PCT/US2013/058774.

* cited by examiner

CONTINUOUS CZOCHRALSKI METHOD AND APPARATUS

CROSS REFERENCE TO RELATED APPLICATIONS

This application is a 371 national stage application of international application PCT/US2013/058774 filed Sep. 9, 2013, which claims the benefit of U.S. Provisional Application Ser. No. 61/699,004 filed Sep. 10, 2012, all of which are incorporated herein by reference.

FIELD OF THE INVENTION

The present invention relates to the preparation of an ingot, such as a silicon ingot, using the Continuous Czochralski growth method, as well as to an apparatus for preparing the ingot by this method.

BACKGROUND OF THE INVENTION

Description of the Related Art

One of the most efficient and economical methods for preparing a silicon ingot for use in fabricating materials for integrated circuits and photovoltaic solar cells is the Czochralski (CZ) method. In the typical CZ process, a silicon charges is placed in a crucible and melted to its liquid state at a temperature of about 1416° C. A small crystalline silicon seed of predetermined crystalline orientation is then lowered to contact the surface of the melt and then gradually withdrawn. With proper control of temperatures, the liquid silicon freezes on the crystalline seed with the same orientation as that of the seed. The seed is then slowly raised away from the melt to form a growing crystalline ingot of silicon having a final length of a meter or more and a diameter of hundreds of millimeters Two types of CZ techniques are known, often called the batch Czochralski method and the continuous Czochralski method. In batch CZ, the entire amount of charge material required for growing a silicon ingot is melted at the beginning of the process in a heated crucible, and one ingot is drawn to substantially deplete the crucible. The crucible is then discarded after one ingot. By comparison, in continuous Czochralski (CCZ) growth, the charged material is continually or periodically replenished during the growth process and, as a result, multiple ingots can be pulled from a single crucible that is replenished during growth. The crucible is only discarded and replaced by a fresh crucible after several ingot cycles.

To carry out the CCZ process, it is necessary to modify the traditional batch Czochralski growth apparatus to include a means for feeding additional charge material to the melt in a continuous or semi-continuous fashion without adversely effecting the properties of the growing ingot. In order to reduce the adverse effects of this replenishing activity on simultaneous crystal growth, the traditional quartz crucible is often modified to provide an outer or annular melt zone into which the added material is delivered along with an inner growth zone from which the silicon ingot is pulled. These zones are in fluid flow communication with one another.

While these and other known modifications enable CCZ to be used for preparing silicon ingots having good overall properties, there remains a need in the industry for improved CCZ methods and apparatuses, especially those which minimize or eliminate effects caused by replenishing the crucible while the ingot is pulled.

SUMMARY OF THE INVENTION

The present invention relates to a Czochralski growth apparatus, preferably a continuous Czochralski growth apparatus comprising a crucible having an inner growth zone and an outer feed zone separated by at least one wall which has at least one opening that provides restricted fluid communication between the zones. The apparatus further comprises a solid feedstock delivery system comprising a feeder having a delivery point overhanging the outer feed zone of the crucible, delivering solid feedstock therein, and at least one particle blocking device substantially preventing the solid feedstock from entering the inner growth zone of the crucible. In one embodiment, the apparatus further comprises a thermally-insulated shield positioned above the inner growth zone of the crucible. Preferably the thermally-insulated shield and the wall of the crucible are separated by a gap, and the particle blocking device substantially prevents the solid feedstock from passing through the gap. The particle blocking device can be a particle shield that at least partially covers the inner growth zone of the crucible. For example, the particle shield may be positioned on the wall of the crucible projecting into the inner growth zone. Alternatively, or in addition, the particle blocking device can be an insulated housing circumferentially positioned around the thermally-insulated shield, such as around its external bottom edge. Furthermore, or alternatively, the particle blocking device may be a particle shield positioned at least partially around or within the solid feedstock delivery system, particularly around the delivery point of the feeder, such as a sleeve positioned with the feeder.

The present invention further relates to a method of Czochralski growth, to preferably of a method of continuous Czochralski growth, of a silicon ingot comprising the steps of providing a crucible in a Czochralski growth apparatus having at least one wall separating an inner growth zone and an outer feed zone, providing a solid precharge comprising silicon into the inner growth zone and the outer feed zone, melting the solid precharge, initiating growth of the solid ingot, and removing the resulting silicon ingot from the apparatus. While growing the silicon ingot, solid feedstock is delivered to the outer feed zone of the crucible from a silicon delivery system. Furthermore, the Czochralski growth apparatus comprises at least one particle blocking device substantially preventing the solid silicon from entering the inner growth zone of the crucible. Preferably the Czochralski growth apparatus used in the method of the present invention is the apparatus of the present invention.

It is to be understood that both the foregoing general description and the following detailed description are exemplary and explanatory only and are intended to provide further explanation of the present invention, as claimed.

DETAILED DESCRIPTION OF THE INVENTION

Figure 1:
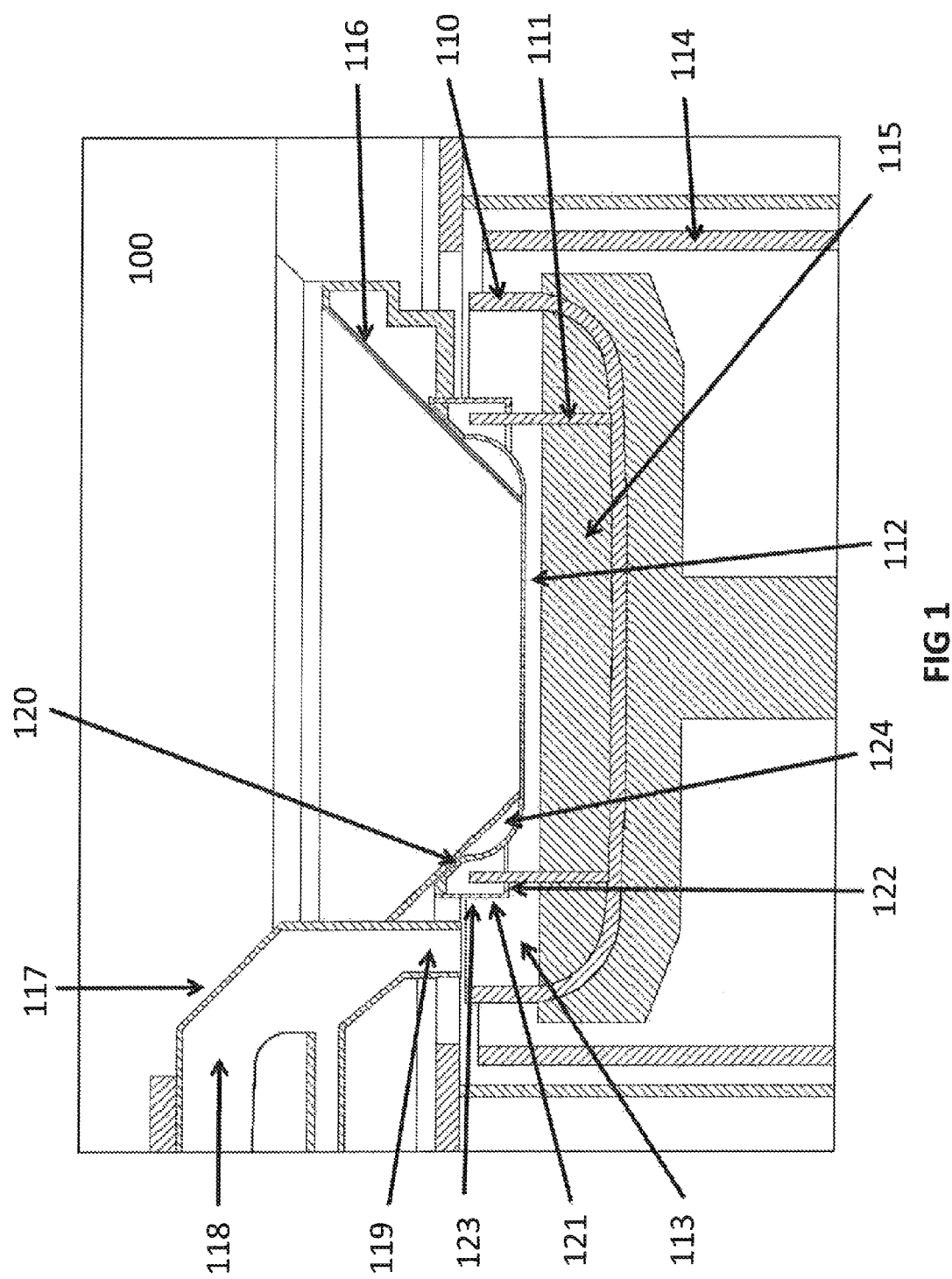
FIG. 1, FIG. 2, and FIG. 3 are schematic views of embodiments of a Czochralski growth apparatus and method of the present invention.

The present invention relates to an apparatus and method of Czochralski growth of a silicon ingot. The Czochralski growth apparatus of the present invention comprises a crucible, a solid feedstock delivery system, and at least one particle blocking device, each contained within a growth chamber in which an ingot, such as a silicon ingot, is produced. The growth chamber comprises sidewalls and a top wall forming a heatable space in which the crucible is provided. The crucible may contain a precharge comprising silicon, which is melted in the crucible within the growth chamber. The crucible, which can be supported from below by one or more pedestals, can be any known in the art for use in crystal growing that is capable of containing both solid and liquid material, particularly solid and liquid silicon. For example, the crucible can be a quartz crucible or can be a graphite crucible containing a quartz inner liner. The crucible can also have any cross-sectional shape depending, for example, on the geometry of the crystal growth system, but typically has a circular cross-sectional shape.

The crucible comprises at least two zones, each separated by a wall or other separating means having at least one opening, such as a notch, hole, or pipe, that provides restricted fluid communication between the zones. For example, the crucible can comprise a wall that divides it into two zones, an inner zone, referred to herein as the inner growth zone, and an outer zone, referred to herein as the outer feed zone. These zones are in fluid communication with each other. The inner zone is where growth of the ingot is initiated and from where the ingot is grown while the outer zone feeds additional material to the inner zone as the ingot is grown. Thus, as material is removed from the inner growth zone by the crystallization process, fresh material can enter from the outer feed zone. Preferably, the inner growth zone and/or the outer feed zone contain a solid precharge to be melted therein comprising silicon and may further comprise at least one dopant material, including, for example, phosphorus, boron, gallium, indium, aluminum, arsenic, or antimony.

The solid feedstock delivery system of the Czochralski growth apparatus of the present invention provides solid feedstock to the crucible either prior to or, preferably, while the crystalline ingot is being grown and drawn. Thus, preferably, the solid feedstock delivery system is capable of delivering material in solid form to the crucible while it is heated. The feedstock may be provided continuously throughout the ingot growth or in batches (semi-continuously). Preferably, the feedstock comprises silicon, including metallurgical grade silicon or solar grade silicon, and further may comprise at least one dopant material, such as phosphorus, boron, gallium, indium, aluminum, arsenic, or antimony.

A variety of means for conveying solid material to the crucible can be used. For example, the solid feedstock delivery system can comprise a feeder, such as a trough system, through which a controlled amount of solid silicon is provided to the crucible. The feeder can comprise at least one delivery point that overhangs the crucible. When the crucible comprises an inner growth zone and an outer feed zone, preferably the solid feedstock delivery system provides material to the outer feed zone of the crucible in order to minimize disturbance of the molten silicon from which the crystalline ingot is grown or pulled. A specific example of a suitable solid feedstock delivery system usable in the Czochralski growth apparatus of the present invention is described in U.S. patent application Ser. No. 13/446,414, which is incorporated in its entirety by reference herein. Thus, as material is removed from the inner growth zone by the crystallization process and fresh material enters the inner growth zone from the outer feed zone, additional solid feedstock is provided to the outer feed zone by the delivery system, thereby maintaining a relatively constant source of molten material for continuous growth of the crystalline ingot.

The Czochralski growth apparatus of the present invention may further comprise a thermally-insulated shield positioned over the crucible and, preferably, over the inner growth zone of the crucible. The shield protects the growing ingot from being excessively heated as a molten charge is maintained in the crucible and therefore is made of or comprises material possessing low thermal conductivity that is capable of withstanding the high temperatures and conditions within the growth apparatus. A variety of types of thermally-insulated shields are known in the art, and any of these can be used in the apparatus of the present invention. The size and shape will depend on the geometry of the growth apparatus. For example, for a crucible having a circular cross-sectional shape, and used to form a silicon ingot having a generally circular cross-sectional shape, the thermally-insulated shield preferably also has a circular cross-sectional shape and is generally cylindrical or conical in geometry. More preferably, the thermally-insulated shield has an inverse conical shape, being larger in cross-sectional area at the top of the shield than at the bottom and has a diameter at the bottom that is large enough for the growing ingot to pass through.

The Czochralski growth apparatus of the present invention may further comprise at least one system from which growth of the crystalline ingot can be initiated. For example, the apparatus can further comprise a pull mechanism including a retractable cable on which a small crystalline seed, such as a silicon crystal, is supported. Using this mechanism, the seed, having a predetermined crystalline orientation, can be lowered into contact with the molten material contained within the crucible and then gradually withdrawn. With proper control of temperatures, the liquid material freezes on the crystalline seed with the same orientation as that of the seed, thereby initiating growth of the crystalline ingot. The seed is then slowly raised away from the melt to form a growing crystalline ingot having a desired final length and diameter. One or more load cells supporting the pull mechanism can also be used, along with a control means responsive to the load cells for activating the supply of feedstock into the growth apparatus from the solid feedstock delivery system.

As noted above, the crucible preferably has an inner growth zone and an outer feed zone, and the solid feedstock delivery system comprises a feeder having a delivery point overhanging the outer feed zone of the crucible, which minimizes disturbance of the molten silicon in the inner growth zone as the ingot is drawn. However, it has been observed that, even with a feeder comprising a delivery point positioned over the outer growth zone of the crucible, solid feedstock particles can still inadvertently enter into the inner growth zone and negatively impact the crystalline structure of the growing ingot. For example, silicon ingots are typically prepared in by a Czochralski growth process under an inert atmosphere, and convection currents from the gas have been found to carry particles of solid silicon from the silicon feedstock delivery system into the inner growth zone. Furthermore, particles can also enter the growth zone through unintended particle rebound and through boiling of the molten silicon contained in the outer feed zone.

For this reason, the Czochralski growth apparatus of the present invention further comprises at least one particle blocking device which substantially prevents solid feedstock from entering the inner growth zone of the crucible. Any device capable of blocking particulate material can be used. For example, the device can be a solid barrier or can have a plurality of holes or spaces, such as a screen or mesh, to allow flow of a gaseous atmosphere without substantial passage of particulates.

Multiple devices can also be used in the growth apparatus. The device can be made of any material capable of withstanding the impact of solid material and further capable of withstanding the high temperatures and conditions within the growth apparatus, but without having a substantial effect of the overall thermal profile of the growth apparatus. Preferably, the particle blocking device can comprise quartz, graphite, silicon carbide coated graphite, or silicon carbide. More preferably, the device is made of quartz.

The particle blocking device can be positioned at various locations within the Czochralski growth apparatus as long as it does not have a substantial negative impact on the growth of the ingot. For example, the particle blocking device can be a particle shield positioned to at least partially cover the inner growth zone of the crucible, such as a screen placed over the surface of this zone. In addition, the particle blocking device can also be a particle shield positioned on the wall of the crucible separating the inner growth zone and the outer feed zone. This shield can extend upwardly or inwardly from the wall over the inner growth zone. Preferably, the particle shield is positioned adjacent to the location where the solid feedstock delivery system provides the solid feedstock into the outer feed zone of the crucible.

As another example, the particle blocking device can be a particle shield positioned at the opening in the wall of the crucible. In this way, solid feedstock delivered into the melt contained within outer growth zone of the crucible would be prevented from passing through the opening and entering the inner growth zone by the particle shield. In particular, the particle shield can be a particulate screen across the opening in the wall or can be a layer of quartz pellets placed in front of or within the opening.

Also as an example, the particle blocking device can be a particle shield positioned at least partially around or within the solid feedstock delivery system, particularly around the delivery point of the feeder of the delivery system from which solid feedstock exits and enters the outer feed zone of the crucible. For example, the particle shield can be a sleeve positioned within the feeder of the solid feedstock delivery system. The sleeve preferably extends at least partially below the delivery point of the feeder and, more preferably, below the wall of the crucible, having a lower edge positioned within the outer feed zone, thereby preventing any stray particles of feedstock from entering the inner growth zone.

As described above, the Czochralski growth apparatus of the present invention may further comprise a thermally-insulated shield or cone positioned over and above the inner growth zone of the crucible. This can create a gap between the thermally-insulated shield and the wall of the crucible. For such an apparatus, the particle blocking device prevents solid feedstock from passing through this gap and entering the inner growth zone. For example, the particle blocking device can be a particle shield positioned on the wall of the crucible and extending to a position adjacent to the thermally-insulating shield, thereby effectively preventing solid material from passing through the gap without completely blocking it. Alternatively, or in addition, the particle blocking device can be an insulated housing circumferentially positioned around the thermally-insulated shield, preferably around the outside exterior surface of the shield, having a size and shape sufficient to prevent solid material from entering the gap. The insulated housing can be positioned at least partially above the outer feed zone, acting as a deflector for solid material entering this zone from the feeder, or can be positioned at least partially above the inner growth zone, effectively preventing solid material from passing through the gap. Preferably, the thermally-insulated shield is positioned within the inner growth zone, having a lower edge that is below the upper edge of the wall separating the zones in the crucible, and the insulated housing is circumferentially positioned around the outer surface of the thermally-insulated shield at the lower edge.

Figure 2:
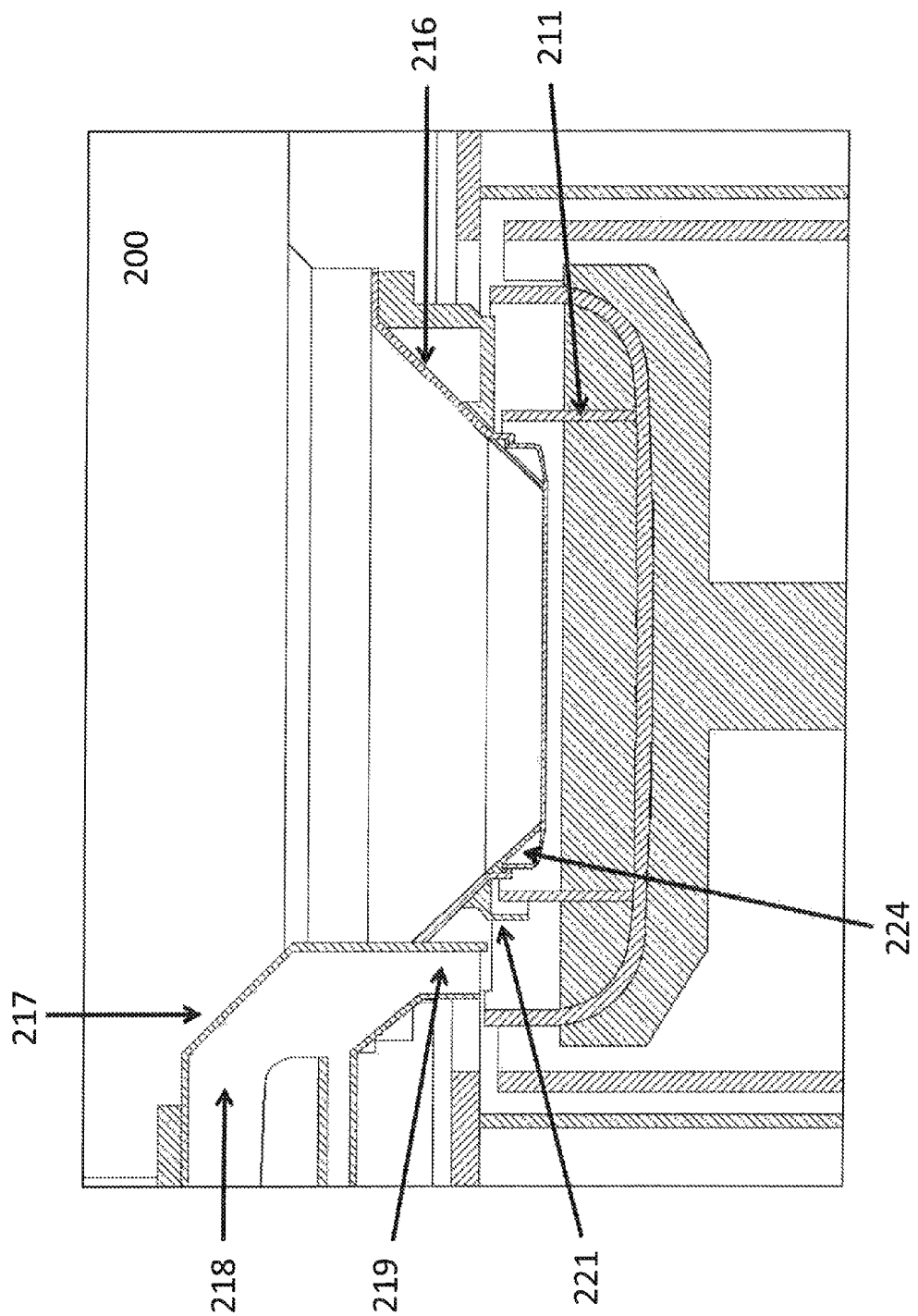
Figure 3:
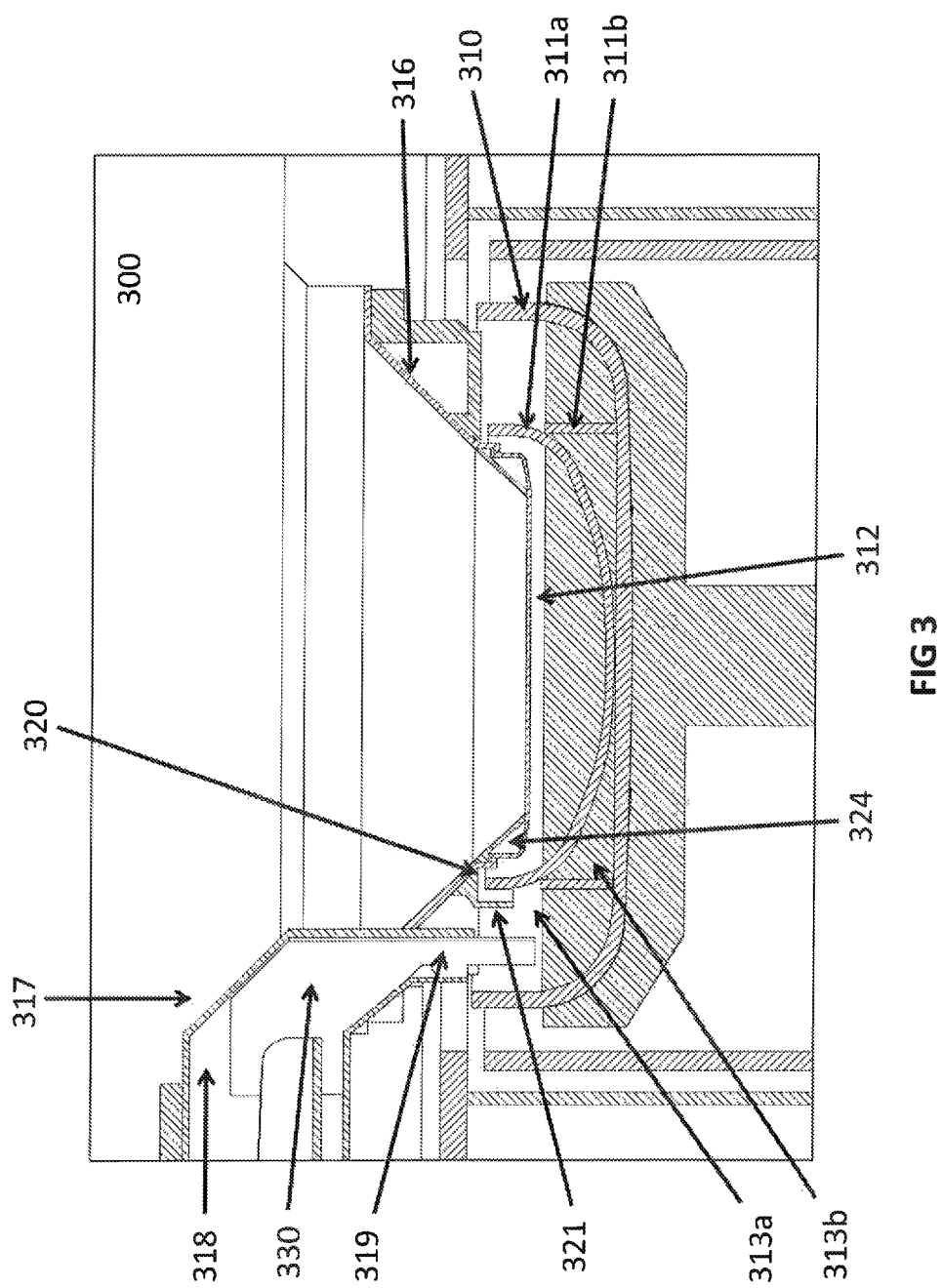

Specific embodiments and components of the Czochralski growth apparatus of the present invention are shown in FIG. 1, FIG. 2, and FIG. 3 and discussed below. However, it should be apparent to those skilled in the art that these are merely illustrative in nature and not limiting, being presented by way of example only. Numerous modifications and other embodiments are within the scope of one of ordinary skill in the art and are contemplated as falling within the scope of the present invention. In addition, those skilled in the art should appreciate that the specific configurations are exemplary and that actual configurations will depend on the specific system. Those skilled in the art will also be able to recognize and identify equivalents to the specific elements shown, using no more than routine experimentation.

An embodiment of a continuous Czochralski (CCZ) growth apparatus 100, is schematically illustrated in FIG. 1 and comprises crucible 110 having wall 111 that separates crucible 110 into inner growth zone 112 and outer feed zone 113. Wall 111 has at least one opening, such as a notch or hole (not shown) which provides restricted fluid communication between inner growth zone 112 and outer feed zone 113. Crucible 110 is surrounded by heater 114 which heats a precharge to form melt 115. CCZ growth apparatus 100 further comprises thermally-insulated shield 116, having an inverse conical geometry, as well as solid feedstock delivery system 117 comprising feeder 118 having delivery point 119 positioned over outer feed zone 113 of crucible 110. Thermally-insulated shield 116 is positioned over inner growth zone 112 forming gap 120 between thermally-insulated shield 116 and wall 111.

As shown in FIG. 1, continuous Czochralski growth apparatus 100 further comprises at least one particle blocking device that substantially prevents solid feedstock provided by solid feedstock delivery system 117 from entering inner growth zone 112. In particular, the apparatus comprises particle shield 121 positioned at wall 111 and around its entire circumference. Particle shield 121 has horizontal segment 122 partially covering inner growth zone 112 and vertical segment 123 positioned at wall 111, each extending to a position adjacent to thermally-insulated shield 116. In this way, particle shield 121 effectively prevents solid feedstock provided by solid feedstock delivery system 117 from passing through gap 120 and entering inner growth zone 112. In addition, CCZ growth apparatus 100 further comprises insulated housing 124 which is circumferentially positioned around the lower edge of the external surface of thermally-insulated shield 116, which is below the upper edge of wall 111, thereby providing additional protection against particles entering inner growth zone 112.

Another embodiment of the Czochralski growth apparatus of the present invention is shown in FIG. 2, which is similar to that shown in FIG. 1 but with a different particle blocking device. In particular, continuous Czochralski growth apparatus 200 has particle shield 221 positioned on wall 211, but only near delivery point 219 of feeder 218 of solid feedstock delivery system 217. Insulated housing 224 circumferentially positioned around the lower edge of the external surface of thermally-insulated shield 216, which is below the upper edge of wall 211, is also included. In this way, the particle delivery system of CCZ growth apparatus 200 can prevent solid feedstock particles from entering the inner growth zone of the crucible, but also has less impact on the overall thermal profile of the apparatus.

Another embodiment of the Czochralski growth apparatus of the present invention is shown in FIG. 3, which is similar to that shown in FIG. 2 but with a different crucible and a different particle blocking device. In particular, continuous Czochralski growth apparatus 300 comprises crucible 310 having two walls, 311a and 311b, that separates crucible 310 into inner growth zone 312 and two outer feed zones, 313a and 313b. CCZ growth apparatus 300 further comprises thermally-insulated shield 316, having an inverse conical geometry, as well as solid feedstock delivery system 317 comprising feeder 318 having delivery point 319 positioned over outer feed zone 313a of crucible 310. Thermally-insulated shield 316 is positioned over inner growth zone 312 forming gap 320 between thermally-insulated shield 316 and wall 311a. Similar to the embodiment shown in FIG. 2, CCZ growth apparatus 300 has particle shield 321 positioned on wall 311a near delivery point 319 along with insulated housing 324 circumferentially positioned around the lower edge of the external surface of thermally-insulated shield 316, which is below the upper edge of wall 311a. In addition, sleeve 330 is provided within feeder 318 and extends below delivery point 319 and below wall 311a, which directs solid feedstock directly into outer feed zone 313a and preventing particles from enter inner growth zone 312.

As discussed above, the present invention further relates to a method of Czochralski growth of a silicon ingot. Preferably the method is a continuous Czochralski growth method. The method comprises the step of providing a crucible in a Czochralski growth apparatus having at least one wall separating an inner growth zone and an outer feed zone, the wall having at least one opening providing restricted fluid communication between the inner growth zone and the outer feed zone and further providing a solid precharge comprising silicon into the inner growth zone and the outer feed zone of the crucible. These steps can occur in either order. Thus, the crucible can be charged either prior to or after being placed into the apparatus. The crucible can be any of those described above.

Subsequently, the solid precharge in the inner growth zone and in the outer feed zone are heated to form a melt, and growth of the silicon ingot is initiated from the inner growth zone. While growing the silicon ingot in the method of the present invention, solid feedstock comprising silicon is delivered from a silicon delivery system into the outer feed zone. The silicon delivery system comprises a feeder having a delivery point overhanging the outer feed zone of the crucible and delivering solid silicon therein and can be any of those described above. The resulting silicon ingot is then removed from the Czochralski growth apparatus.

For the method of the present invention, the Czochralski growth apparatus comprises at least one particle blocking device substantially preventing the solid silicon from entering the inner growth zone of the crucible. The particle blocking device can be any of those described above. Thus, preferably, the method of Czochralski growth of the present invention utilizes the Czochralski growth apparatus of the present invention. It has been found that the resulting silicon ingot has exception properties, particularly uniformity, due to the specific exclusion of solid feedstock from the inner growth zone of the crucible. Thus, the present invention further relates to a silicon ingot produced by the method of the present invention and/or using the Czochralski growth apparatus of the present invention.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their present invention further relates to a silicon ingot produced by the method of the present invention and/or using the Czochralski growth apparatus of the present invention.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A Czochralski growth apparatus comprising
   a crucible having at least one wall separating an inner growth zone and an outer feed zone, the wall having at least one opening providing restricted fluid communication between the inner growth zone and the outer feed zone;
   a solid feedstock delivery system comprising a feeder having a delivery point overhanging the outer feed zone of the crucible and delivering solid feedstock comprising silicon therein;
   at least one particle blocking device substantially preventing the solid feedstock from entering the inner growth zone of the crucible; and
   an thermally-insulated shield positioned above the inner growth zone of the crucible, wherein the thermally-insulated shield and the wall are separated by a gap,
   wherein the particle blocking device prevents the solid feedstock from passing through the gap, and
   wherein the particle blocking device includes a vertical segment positioned at the wall of the crucible and extending to a position adjacent to the thermally-insulated shield.

2. The Czochralski growth apparatus of claim 1, wherein the particle blocking device is a particle shield at least partially covering the inner growth zone of the crucible.

3. The Czochralski growth apparatus of claim 1, wherein the particle blocking device is a particle shield positioned on the wall of the crucible projecting into the inner growth zone.

4. The Czochralski growth apparatus of claim 1, wherein the particle blocking device is a particle shield positioned at the opening of the wall of the crucible.

5. The Czochralski growth apparatus of claim 1, wherein the particle blocking device is a particle shield positioned at least partially around or within the delivery point of the feeder.

6. The Czochralski growth apparatus of claim 5, wherein the particle blocking device is a sleeve positioned within the feeder, the sleeve extending at least partially below the delivery point of the feeder and having a lower edge positioned within the outer feed zone of the crucible.

7. The Czochralski growth apparatus of claim 1, wherein the particle blocking device is an insulated housing circumferentially positioned around the thermally-insulated shield.

8. The Czochralski growth apparatus of claim 7, wherein the insulated housing is positioned at least partially above the outer feed zone.

9. The Czochralski growth apparatus of claim 7, wherein the insulated housing is positioned at least partially above the inner growth zone.

10. The Czochralski growth apparatus of claim 7, wherein the insulated housing is externally positioned around the thermally-insulated shield.

11. The Czochralski growth apparatus of claim 7, wherein the thermally-insulated shield has a lower edge positioned within the inner growth zone below an upper edge of the wall, and wherein the insulated housing is positioned around the lower edge of the thermally-insulated shield.

12. A method of Czochralski growth of a silicon ingot comprising the steps of:
  i) providing a crucible in a Czochralski growth apparatus having at least one wall separating an inner growth zone and an outer feed zone, the wall having at least one opening providing restricted fluid communication between the inner growth zone and the outer feed zone;
  ii) providing a solid precharge comprising silicon into the inner growth zone and the outer feed zone of the crucible;
  iii) melting the solid precharge in the inner growth zone and in the outer feed zone;
  iv) initiating growth of the silicon ingot from the inner growth zone;
  v) delivering solid feedstock comprising silicon from a silicon delivery system into the outer feed zone while growing the silicon ingot, the silicon delivery system comprising a feeder having a delivery point overhanging the outer feed zone of the crucible and delivering solid silicon therein; and
  vi) removing the silicon ingot from the Czochralski growth apparatus; wherein the Czochralski growth apparatus comprises at least one particle blocking device substantially preventing the solid silicon from entering the inner growth zone of the crucible, and a thermally-insulated shield positioned above the inner growth zone of the crucible,
  wherein the thermally-insulated shield and the wall are separated by a gap, and the particle blocking device prevents the solid feedstock from passing through the gap, and
  wherein the particle blocking device is a particle shield and includes a vertical segment positioned at the wall of the crucible and extending to a position adjacent to the thermally-insulated shield.

13. The method of claim 12, wherein the solid feedstock further comprises at least one dopant material.

14. The method of claim 13, wherein the dopant material is phosphorus, boron, gallium, indium, or aluminum, arsenic, antimony.

15. The method of claim 12, wherein the inner growth zone and the outer feed zone comprise a solid precharge comprising silicon to be melted therein.

16. The method of claim 15, wherein the solid precharge in the inner growth zone, the outer feed zone, or both further comprises at least one dopant material.

17. The method of claim 12, wherein the Czochralski growth apparatus is a continuous Czochralski growth apparatus.

* * * * *